(12) United States Patent
Lin et al.

(10) Patent No.: US 7,685,491 B2
(45) Date of Patent: Mar. 23, 2010

(54) TEST GENERATION METHODS FOR REDUCING POWER DISSIPATION AND SUPPLY CURRENTS

(76) Inventors: Xijiang Lin, 19772 Bennington Ct., West Linn, OR (US) 97068; Janusz Rajski, 6502 Horton Rd., West Linn, OR (US) 97068

(*) Notice: Subject to any disclaimer, the term of this patent is extended or adjusted under 35 U.S.C. 154(b) by 490 days.

(21) Appl. No.: 11/784,460

(22) Filed: Apr. 5, 2007

(65) Prior Publication Data

US 2007/0250749 A1 Oct. 25, 2007

Related U.S. Application Data

(60) Provisional application No. 60/789,687, filed on Apr. 5, 2006.

(51) Int. Cl.
*G01R 31/28* (2006.01)
(52) U.S. Cl. .................. 714/738; 714/732
(58) Field of Classification Search ............. 714/724, 714/726, 728, 732, 738, 741
See application file for complete search history.

(56) References Cited

U.S. PATENT DOCUMENTS

| | | | | |
|---|---|---|---|---|
| 4,320,509 | A * | 3/1982 | Davidson | 714/732 |
| 6,158,032 | A * | 12/2000 | Currier et al. | 714/726 |
| 7,155,648 | B2 * | 12/2006 | Jas et al. | 714/726 |
| 7,412,637 | B2 * | 8/2008 | Wang et al. | 714/729 |
| 7,484,151 | B2 * | 1/2009 | Balakrishnan et al. | 714/728 |
| 2002/0194546 | A1 * | 12/2002 | Ooishi | 714/42 |
| 2005/0080575 | A1 * | 4/2005 | Hildebrant | 702/70 |
| 2005/0081130 | A1 * | 4/2005 | Rinderknecht et al. | 714/726 |

OTHER PUBLICATIONS

"Using an embedded processor for efficient deterministic testing of systems-on-a-chip" by Jas et al. This paper appears in: Computer Design, 1999. (ICCD '99) International Conference on Publication Date: 1999 On pp. 418-423 ISBN: 0/7695-0406-X INSPEC Accession No. 6422952.*

"A test vector ordering technique for switching activity reduction during test operation" by Girard et al. This paper appears in: VLSI, 1999. Proceedings. Ninth Great Lakes Symposium on Publication Date: Mar. 4-6, 1999 On pp. 24-27 ISBN: 0-7695-0104-4 INSPEC Accession No. 6364310.*

Abramovici et al., *Digital Systems Testing and Testable Design*, pp. 229-234 (1990).

(Continued)

*Primary Examiner*—Cynthia Britt
(74) *Attorney, Agent, or Firm*—Klarquist Sparkman, LLP

(57) ABSTRACT

Disclosed herein are representative embodiments of methods, apparatus, and systems used for generating test patterns as may be used as part of a test pattern generation process (for example, for use with an automatic test pattern generator (ATPG) software tool). In one exemplary embodiment, hold probabilities are determined for state elements (for example, scan cells) of a circuit design. A test cube is generated targeting one or more faults in the circuit design. In one particular implementation, the test cube initially comprises specified values that target the one or more faults and further comprises unspecified values. The test cube is modified by specifying at least a portion of the unspecified values with values determined at least in part from the hold probabilities and stored.

27 Claims, 12 Drawing Sheets

OTHER PUBLICATIONS

Bhunia et al., "Low-Power Scan Design Using First-Level Supply Gating," *IEEE Trans. on VLSI Systems*, vol. 13, No. 3, pp. 384-395 (Mar. 2005).

Bonhomme et al., "Design of Routing-Constrained Low Power Scan Chains," *Proc. of the Design, Automation and Test in Europe Conference*, pp. 1-6 (2004).

Butler et al., "Minimizing Power Consumption in Scan Testing: Pattern Generation and DFT Techniques," *Proc. ITC*, pp. 355-364 (2004).

Dabholkar et al., "Techniques for Minimizing Power Dissipation in Scan and Combinational Circuits During Test Application," *IEEE Trans. on Computer-Aided Design of Integrated Circuits and Systems*, vol. 17, No. 12, pp. 1325-1333 (Dec. 1998).

El-Maleh et al., "An Efficient Test Relaxation Technique for Combinational & Full-Scan Sequential Circuits," *Proc. VLSI Test Symp.*, 7 pp. (2002).

Gerstendörfer et al., "Minimized Power Consumption for Scan-Based BIST," *Proc. ITC*, pp. 77-84 (1999).

Girard, "Low Power Testing of VLSI Circuits: Problems and Solutions," 7 pp. (also published as Girard, Girard, "Low Power Testing of VLSI Circuits: Problems and Solutions," 7 pp. (also published as Girard, "Low Power Testing of VLSI Circuits: Problems and Solutions," *IEEE Proc. on Symp. on Quality Electronic Design*, pp. 173-179 (2000)).

Lee et al., "Test Power Reduction with Multiple Capture Orders," *Proc. of the Asian Test Symp.*, pp. 1-6 (2004).

Li et al., "On Reducing Peak Current and Power During Test," *Proc. IEEE Computer Society Annual Symp. on VLSI*, 6 pp. (May 2005).

Lin et al., "Constraint Extraction for Pseudo-Functional Scan-based Delay Testing," *IEEE*, pp. 166-171 (Jan. 2005).

Liu et al., "Constrained ATPG for Broadside Transition Testing," *Proc. Int'l Symp. on Defect and Fault Tolerance in VLSI Systems*, 8 pp. (2003).

Pomeranz et al., "Generation of Functional Broadside Tests for Transition Faults," *IEEE Trans. on Computer-Aided Design of Integrated Circuits and Systems*, vol. 25, No. 10, pp. 2207-2218 (Oct. 2006).

Pomeranz, "On the Generation of Scan-Based Test Sets with Reachable States for Testing under Functional Operation Conditions," *DAC*, pp. 928-933 (Jun. 7-11, 2004).

Rearick, "Too Much Delay Fault Coverage Is a Bad Thing," *Proc. ITC*, pp. 624-633 (2001).

Remersaro et al., "Preferred Fill: A Scalable Method to Reduce Capture Power for Scan Based Designs," *Proc. ITC*, pp. 1-10 (Oct. 2006).

Rosinger et al., "Scan Architecture With Mutually Exclusive Scan Segment Activation for Shift- and Capture-Power Reduction," *IEEE Trans. on Computer-Aided Design of Integrated Circuits and Systems*, vol. 23, No. 7, pp. 1142-1153 (Jul. 2004).

Sankaralingam et al., "Inserting Test Points to Control Peak Power During Scan Testing," *Proc. Int'l Symp. on Defect and Fault Tolerance in VLSI Systems*, 9 pp. (2002).

Savir et al., "Broad-Side Delay Test," *IEEE Trans. on Computer-Aided Design of Integrated Circuits and Systems*, vol. 13, No. 8, pp. 1057-1064 (Aug. 1994).

Savir, "Skewed-Load Transition Test: Part I, Calculus," *Proc. ITC*, pp. 705-713 (1992).

Saxena et al., "A Case Study of IR-Drop in Structured At-Speed Testing," *Proc. ITC*, pp. 1098-1104 (2003).

Sharifi et al., "Simultaneous Reduction of Dynamic and Static Power in Scan Structures," *Proc. of the Design, Automation and Test in Europe Conference*, 6 pp. (Mar. 2005).

Wang et al., LT-RTPG: A New Test-Per-Scan BIST TPG for Low Heat Dissipation, *Proc. ITC*, pp. 85-94 (1999).

Wen et al., "Low-Capture-Power Test Generation for Scan-Based At-Speed Testing," *Proc. ITC*, pp. 1-10 (Nov. 2005).

Wen et al., "On Low-Capture-Power Test Generation for Scan Testing," *Proc. VLSI Test Symp.*, 6 pp. (May 2005).

Whetsel, "Adapting Scan Architectures for Low Power Operation," *Proc. ITC*, pp. 863-872 (2000).

Zhang et al., "On Generating Pseudo-Functional Delay Fault Tests for Scan Designs," *IEEE Int'l Symp. on Defect and Fault Tolerance in VLSI Systems*, 8 pp. (Oct. 2005).

\* cited by examiner

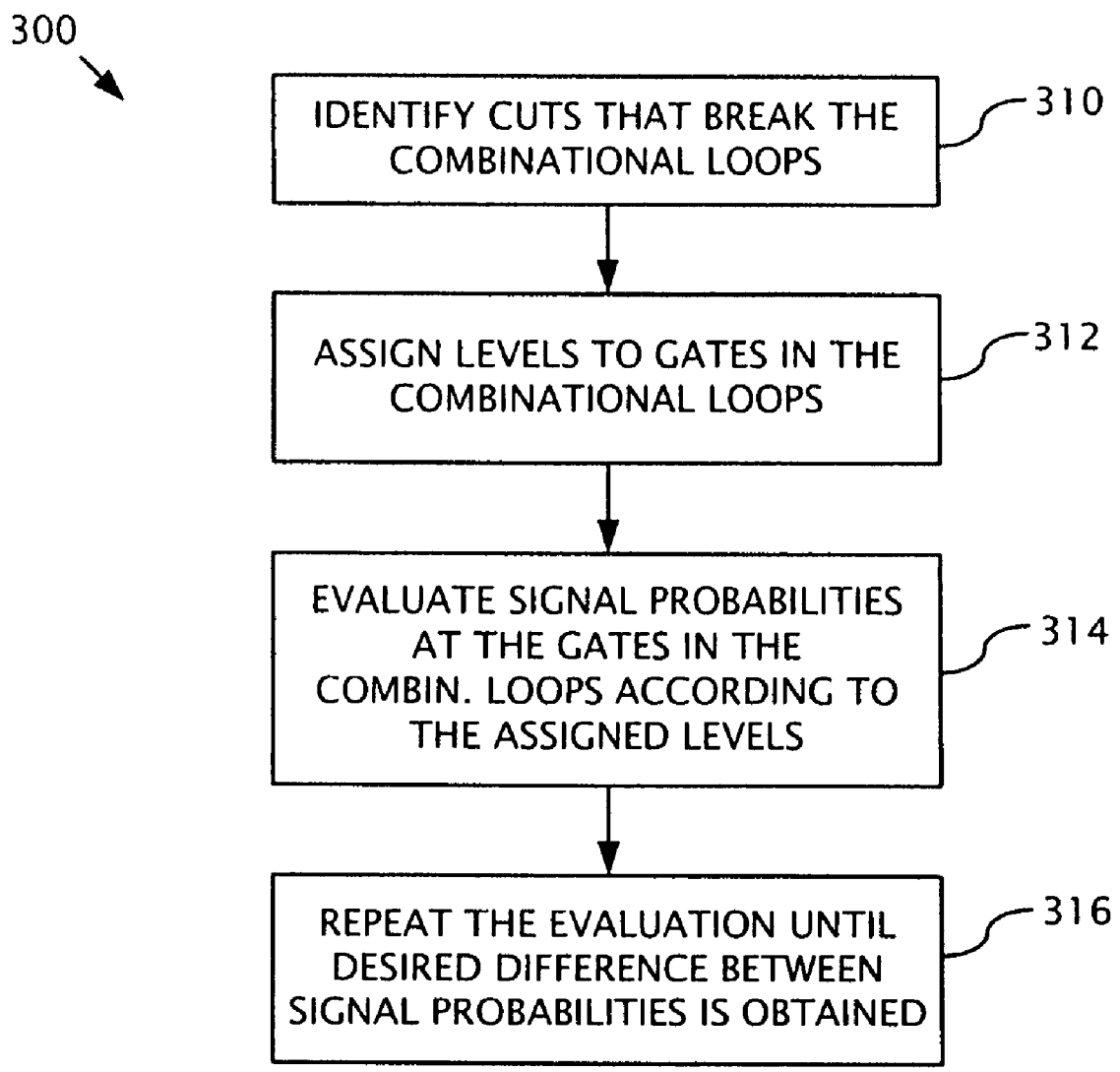

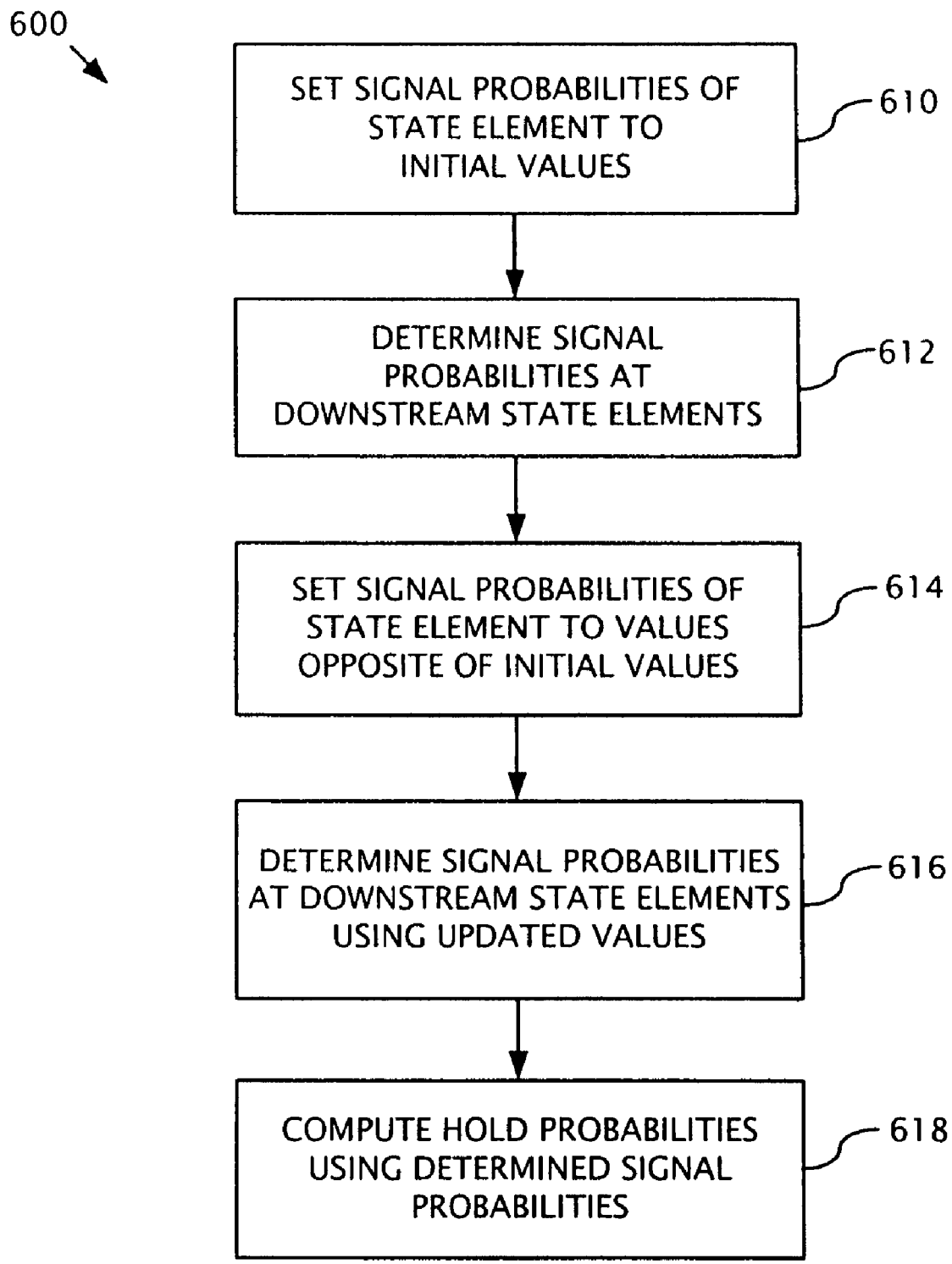

800

$HP_a(0)=0.1, HP_b(0)=0.2, HP_c(0)=0.3$

802

$HP_a(0)=0.1, HP_b(0)=0.2, HP_c(0)=0.3$

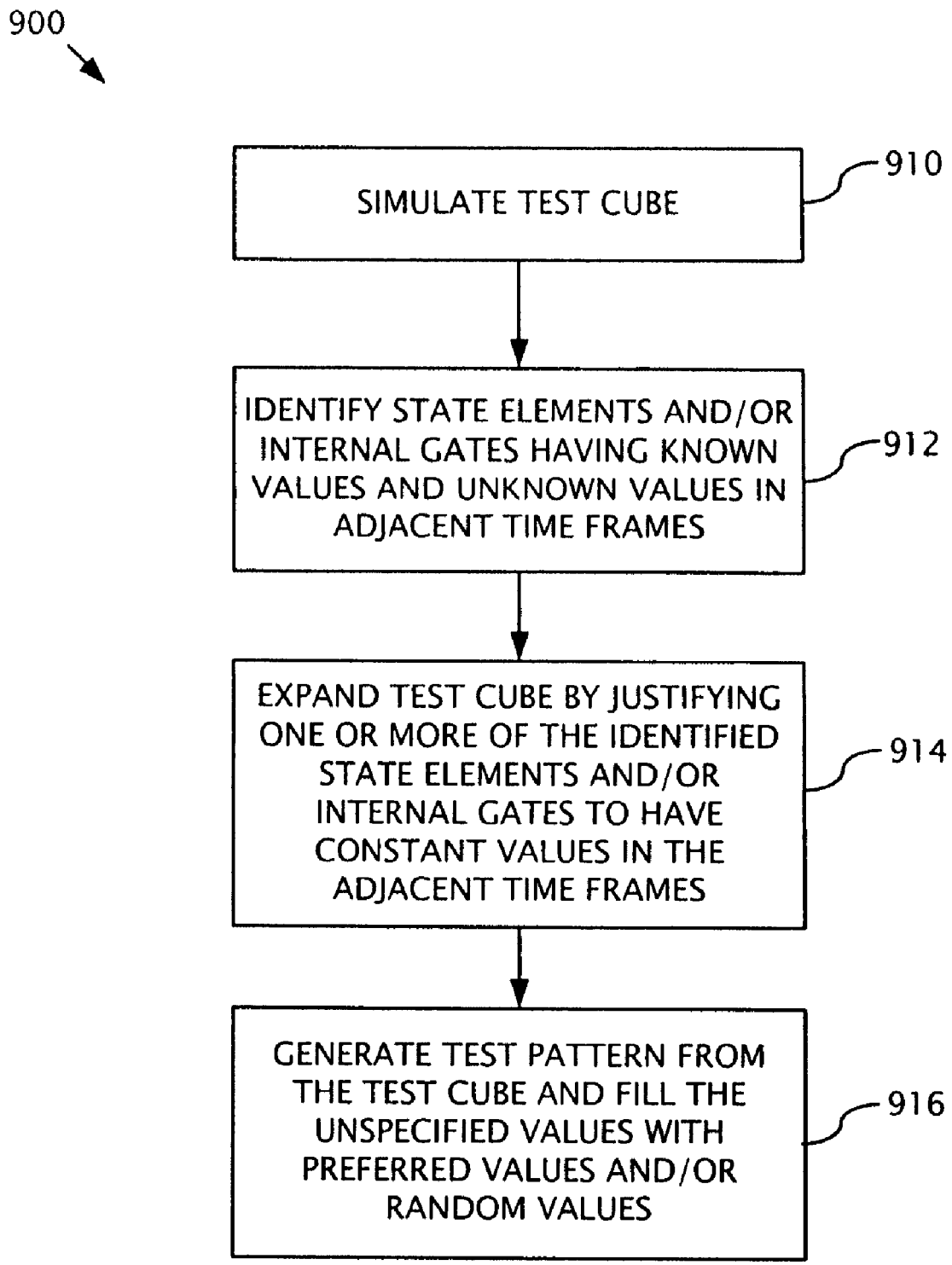

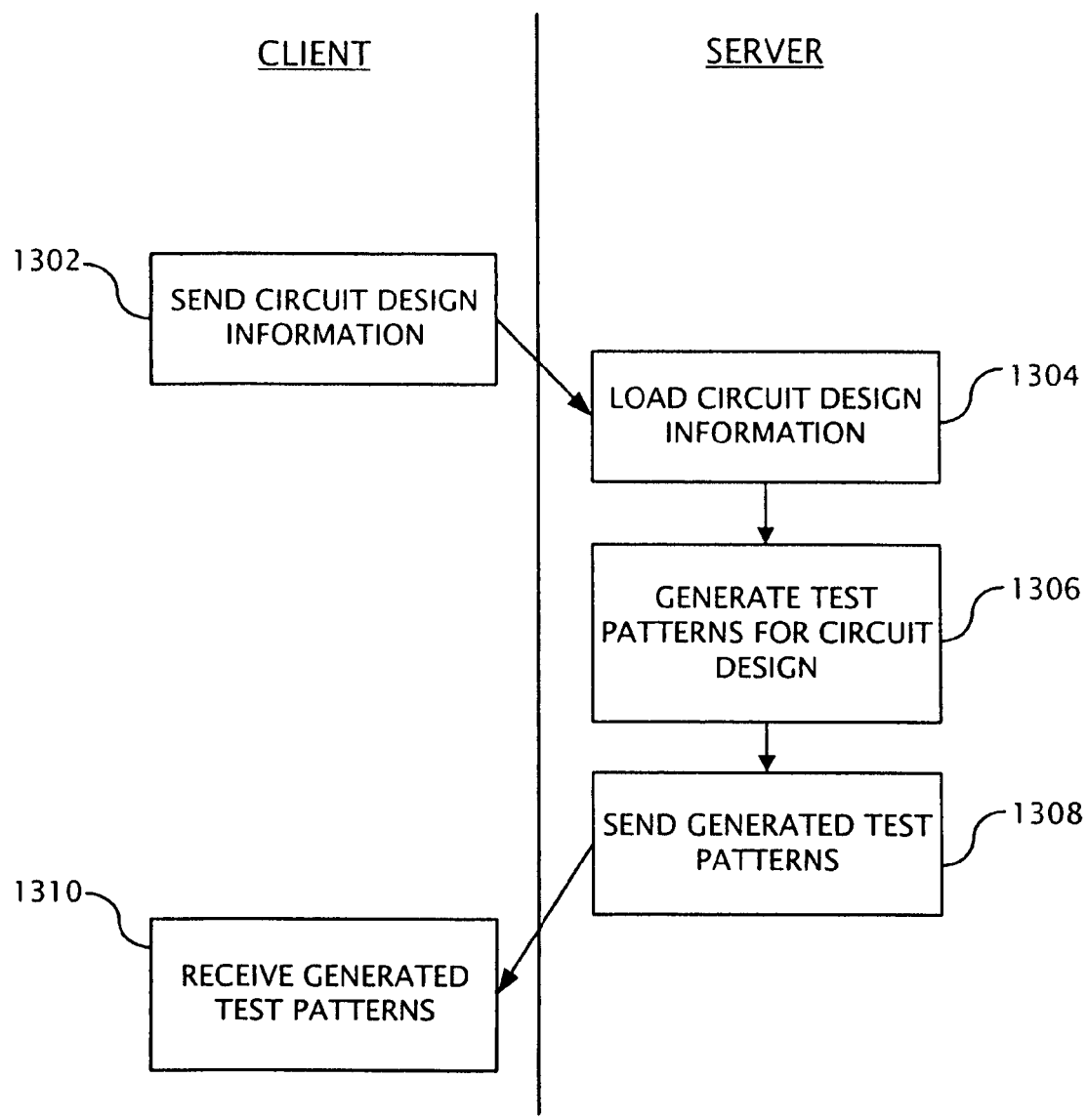

TEST GENERATION METHODS FOR REDUCING POWER DISSIPATION AND SUPPLY CURRENTS

CROSS REFERENCE TO RELATED APPLICATION

This application claims the benefit of U.S. Provisional Patent Application No. 60/789,687, filed Apr. 5, 2006, and entitled "TEST GENERATION METHODS FOR REDUCING POWER DISSIPATION AND SUPPLY CURRENTS," the contents of which are hereby incorporated herein by reference.

FIELD

This application relates generally to the field of testing integrated circuits, and more particularly to the field of generating test patterns for use during integrated circuit testing.

BACKGROUND

The use of automatic test pattern generation (ATPG) to generate test patterns for scan-based or partially-scan-based integrated circuits is quite common. The scan tests generated by a typical ATPG tool, however, can create switching activity on the integrated circuit that far exceeds the activity present during normal operation of the circuit. Excessive switching activity can be created when a scan test causes the circuit-under-test (CUT) to operate outside of its normal functional operation. Furthermore, excessive switching activity can occur during several stages of the testing operation. For example, excessive switching can occur when the scan chain is loading a test pattern, unloading a test response, or when its scan cell contents are updated during the capture cycles (for example, when the scan cells are clocked by one or more functional clocks). Abnormal switching activity can create an abnormal peak power dissipation, an abnormal average power dissipation, and/or undesirable supply currents. Excessive power dissipation can create hot spots that could damage the CUT. Furthermore, excessive peak supply currents can cause supply voltage drops that result in increased gate delays during testing. Such gate delays during testing may cause good chips to fail (for instance, to fail at-speed tests) and cause unnecessary yield loss.

SUMMARY

Disclosed below are representative embodiments of methods, apparatus, and systems used for generating test patterns as may be used as part of a test pattern generation process (for example, for use in an automatic test pattern generator (ATPG) software tool). Embodiments of the disclosed technology can provide a scalable test generation method that reduces peak power, average power dissipation, and/or supply currents during the capture cycles of scan tests. In particular embodiments, the same test coverage as traditional test strategies can be achieved while reducing power during testing. In certain desirable embodiments of the disclosed technology, no additional hardware is required. Furthermore, existing test generation tools can support embodiments of the disclosed technology with only minor modification.

In one disclosed embodiment, signal and hold probabilities derived from the circuit are used to guide the filling of unspecified values in test cubes. The signal and hold probabilities can be computed, for example, before test generation. Unspecified values in a test cube can be filled simultaneously (or substantially simultaneously), making the exemplary method scalable with circuit size. In general, the time to compute the signal and hold probabilities is linearly proportional to the number of gates in the design. Thus, the running time overhead due to the signal/hold probability computation is negligible. In further embodiments described herein, power consumption is reduced by using probabilities to guide test cube generation without losing test coverage.

In particular embodiments of the disclosed technology, one or more of the following method acts are performed (alone or in various combinations and subcombinations with one another): determining one or both of signal probabilities and hold probabilities for logic gates in the circuit; based at least in part on the probabilities determined, determining preferred values for filling primary inputs and/or scan cells; creating a fault list; generating a test cube for detecting one or more target faults in the fault list (for example, using a deterministic test generator); filling unspecified values in the test cube (for example, one, some, or all unspecified values) using either the corresponding preferred values determined or random values; and fault simulating the filled test cube and removing the detected faults from the fault list. The acts of generating, filling, and fault simulating can be repeated until the fault list is empty.

Also disclosed herein are methods for calculating signal probabilities for gates in a combinational loop, and for calculating hold probabilities for state elements (such as scan cells) in the circuit. Methods for calculating relaxed hold probabilities for gates in the circuit with linear computational complexity are also described. Such methods can be used to calculate, for example, relaxed hold probabilities for the gates in a combinational loop.

Also described herein are methods for selecting preferred values filled at primary inputs and/or scan cells based on the results of the probability calculations. The selection methods can help reduce power dissipation and supply currents during capture cycles. Moreover, any of the filling procedures described herein can be performed simultaneously or substantially simultaneously. For instance, according to one exemplary implementation, all unspecified values in the test cube are filled simultaneously or substantially simultaneously.

In another disclosed method, the test generator is guided at least in part by signal probabilities and/or hold probabilities. For instance, in one exemplary embodiment, an unjustified gate is selected during test cube generation for a target fault. The probabilities of the choices for justifying the gate are set (for example, using probability data). In some implementations, the probabilities are determined in an earlier procedure or in connection with another procedure. In one particular implementation, the probability of a choice is set to 0 if the choice creates transitions. The justification choices can be reordered using the probabilities determined (for example, in decreasing order, so that the justification choices producing a transition are last). The unjustified gate can be justified using the reordered justification choices (for example, by selecting the justification choices from highest to lowest).

In another disclosed method for reducing power dissipation and supply currents during capture cycles, a subset of unspecified values in a test cube is deterministically filled. For instance, in one exemplary embodiment, a test cube is simulated. Gates and state elements with values X0, X1, 0X and 1X during adjacent time frames are identified. The test cube is expanded by justifying all or a subset of the identified gates and/or state elements so that the gates and/or state elements have the same values during adjacent time frames.

In yet another disclosed method, a method for achieving a tradeoff between power dissipation reduction and test pattern count is described. In one exemplary method, a subset of unspecified values is filed with random values, and the remaining unspecified values are filled with preferred values. In one particular implementation, the unspecified values to be filled randomly can be selected by extracting the clock sequence used by the test cube, finding the faults in the fault list that are undetected so far but are possibly detected using a similar clock sequence as the extracted one after filling the unspecified values with known values, analyzing the faults collected in order to identify unspecified primary inputs and scan cells that can possibly be used to detect those faults, and filling all or a subset of the candidates identified with either random values or the values most likely to detect the additional faults.

Among the disclosed embodiments are exemplary methods for generating test patterns for testing an integrated circuit. In one exemplary embodiment, hold probabilities are determined for state elements (for example, scan cells) of a circuit design. In this embodiment, the hold probability for a respective state element indicates the probability that the respective state element will output the same logic value during two or more consecutive clock cycles. A test cube is generated targeting one or more faults in the circuit design. In one particular implementation, the test cube initially comprises specified values that target the one or more faults and further comprises unspecified values. The test cube is modified by specifying at least a portion of the unspecified values with values determined at least in part from the hold probabilities. The modified test cube can be stored. In certain implementations, the act of determining the hold probabilities comprises determining signal probabilities for logic gates of the circuit design. The hold probabilities in these implementations are based at least in part on the signal probabilities. The circuit design can also comprise one or more combinational loops. In these embodiments, the act of determining the hold probabilities can comprise determining signal probabilities for logic gates in one or more of the combinational loops (for example, by iteratively computing the signal probabilities of the logic gates in the combinational loops). In certain implementations, the method further comprises determining preferred values for inputting into primary inputs, scan cells, or both primary inputs and scan cells of the circuit design. In these implementations, the preferred values can be determined at least in part from the hold probabilities. Further, the act of modifying the test cube can comprise assigning one or more of the preferred values to corresponding ones of the primary inputs or scan cells. In some implementations, the act of modifying the test cube comprises simultaneously specifying at least some of the unspecified values with values determined at least in part from the hold probabilities. Further, in certain implementations, the act of modifying the test cube comprises specifying a first portion of the unspecified values. In such implementations, the method can further comprise specifying a second portion of the unspecified values of the test cube with randomly selected values. Further, the first portion of the unspecified values or the second portion of the unspecified values can comprise a predetermined percentage of the unspecified values. In particular implementations, the specification of the first portion of the unspecified values and the second portion of the unspecified values results in all of the unspecified values of the test cube being specified.

In another exemplary method of generating test patterns, one or more faults to target are selected from a fault list, and a first set of test pattern values that target the one or more selected faults is generated. A second set of test pattern values that reduces power consumption in the integrated circuit design during testing is also generated. In this embodiment, the second set of test pattern values is determined at least in part from probability values indicating whether one or more state elements (for example, scan cells) in the integrated circuit design will output constant logic values over two or more consecutive clock cycles. A test pattern comprising at least the first set of test pattern values and the second set of test pattern values is stored. In certain implementations, the second set of test pattern values causes no transitions to occur at one or more of the state elements of the integrated circuit design during a capture cycle of testing. In some implementations, the exemplary method further comprises generating a third set of test pattern values, which comprises randomly selected values. The third set of test pattern values can also be stored as part of the test pattern. In particular implementations, the third set of test pattern values is generated before the second set of test pattern values but after the first set of test pattern values. Furthermore, in some implementations, the third set of test pattern values is generated for a predetermined percentage of the remaining test pattern values to be specified after the first set of test pattern values is generated. In particular implementations, signal probabilities for the one or more logic gates are also determined. For example, a respective one of the signal probabilities can indicate the probability that a respective logic gate will have either a logic 0 or a logic 1 value. The probability values indicating whether one or more state elements in the integrated circuit design will output constant logic values over two or more consecutive clock cycles can be determined using the signal probabilities. In certain implementations, the method further comprises simulating the test pattern to determine which faults of the fault list are detected by the test pattern, updating the fault list to remove the faults that are detected by the test pattern, and repeating the acts of selecting, generating the first portion, generating the second portion, and storing the test pattern using the updated fault list.

In another exemplary method disclosed herein, hold probabilities for state elements of a circuit design are determined. In this embodiment, the hold probability for a respective state element indicates the probability that the state element will output a constant logic value during two or more consecutive clock cycles. A test cube is generated targeting one or more faults in the circuit design. In particular implementations of this embodiment, the test cube initially comprises specified values that target the one or more faults and unspecified values. Furthermore, in this embodiment, the act of generating the test cube comprises selecting specified values that justify a desired test value to a logic gate output, the selection being based at least in part on the hold probabilities. The specified values of the test cube can be stored. In certain implementations, the act of selecting the specified values that justify the desired test value to the logic gate output comprises ordering justification choices for the logic gate output based on the hold probabilities. In some implementations, the act of selecting the specified values further comprises evaluating one or more of the justification choices to determine whether selection of the one or more of the justification choices would cause a transition to occur at one or more of the state elements in the circuit design, and reordering the justification choices so that the evaluated justification choices that would cause the transition to occur are not selected. In certain implementations, the test cube is modified by specifying at least a portion of the unspecified values with values determined at least in part from the hold probabilities.

In another disclosed embodiment for generating test patterns, a test cube targeting one or more faults in a circuit design is generated. In this embodiment, the test cube initially comprises specified values that target the one or more faults and unspecified values. A simulation is performed that simulates the application of the test cube to the circuit design. One or more logic gate outputs or state elements that have a respective known value in a first time frame and an unknown value in a second time frame are identified from the simulation. In one particular implementation, the first time frame and the second time frame are consecutive time frames. The test cube is expanded by specifying one or more of the unspecified values in the test cube with values that cause one or more of the identified logic gate outputs or state elements to have the respective known value during both the first time frame and the second time frame, and the expanded test cube is stored. In particular implementations, the first time frame is before the second time frame, whereas in other implementations, the second time frame is before the first time frame. In some implementations, the act of generating the test cube comprises selecting specified values that justify a desired test value to a logic gate output (the selection being based at least in part on the hold probabilities) and storing the specified values of the test cube.

Any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing test patterns or test pattern values (or any other final or intermediate results) produced by any of the disclosed methods are also disclosed.

The foregoing and other objects, features, and advantages of the invention will become more apparent from the following detailed description, which proceeds with reference to the accompanying figures.

BRIEF DESCRIPTION OF THE DRAWINGS

FIG. 3 is a flowchart illustrating an exemplary method of computing signal probabilities in combinational loops as may be used in embodiments of the disclosed test pattern generation methods.

FIG. 6 is a flowchart illustrating an exemplary method of computing hold probabilities as may be used in embodiments of the disclosed test pattern generation methods.

FIG. 9 is a flowchart illustrating an exemplary method of using preferred values (for example, preferred values determined in part from hold probabilities computed using the method of FIG. 6) during test pattern generation.

FIG. 13 is a flowchart illustrating how test patterns can be generated using the networks of FIG. 11 or FIG. 12.

DETAILED DESCRIPTION

Figure 1:
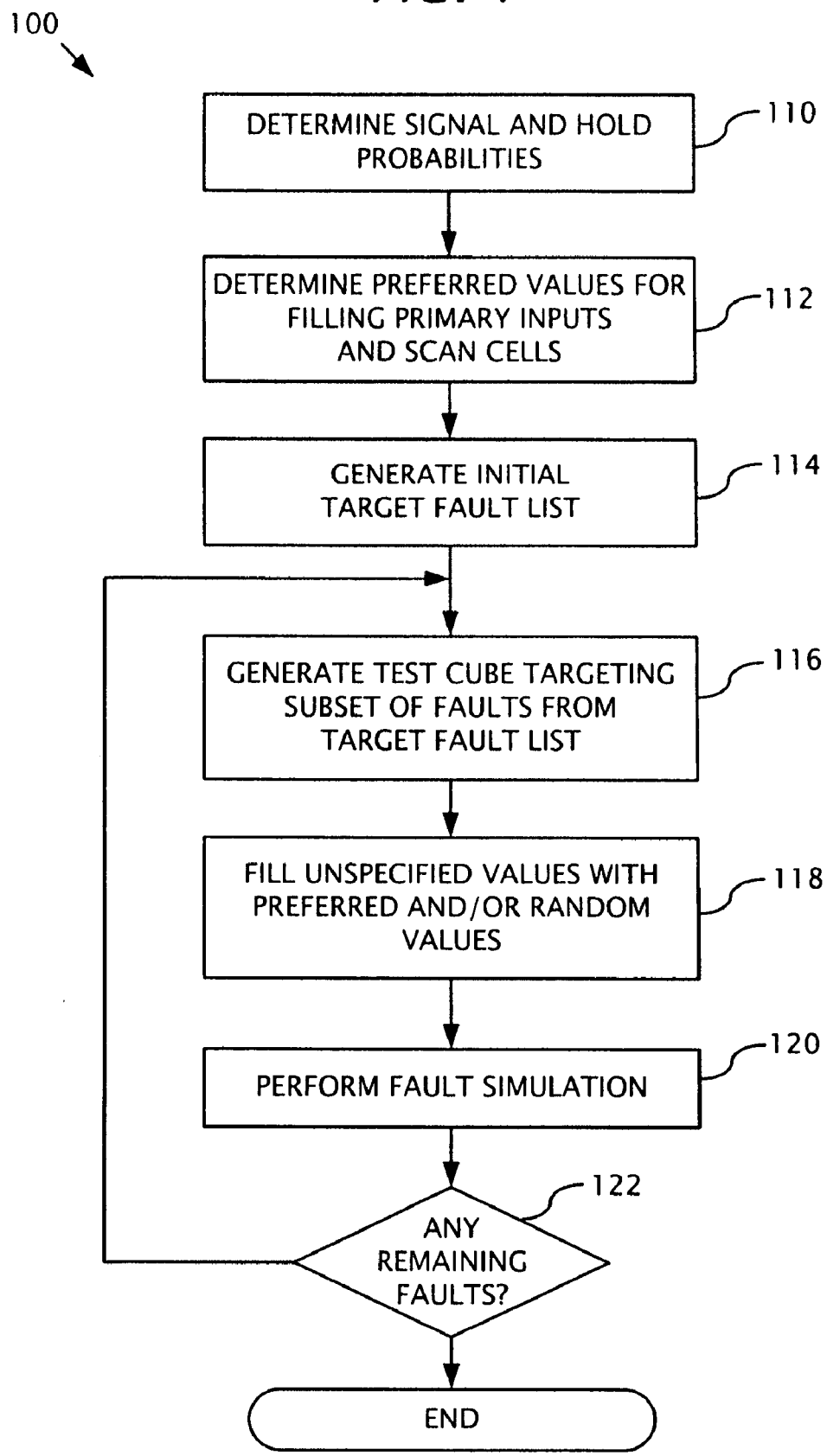
FIG. 1 is a flowchart illustrating test pattern generation according to an embodiment of the disclosed technology.

Disclosed below are representative embodiments of methods, apparatus, and systems used for generating test patterns as may be used as part of a test pattern generation process (for example, for use with an automatic test pattern generator (ATPG) software tool). The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "set" and "determine" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be used to generate test patterns for testing a wide variety of scan-based or partially-scan-based circuits (for example, application-specific integrated circuits (ASICs) (including mixed-signal ASICs), systems-on-a-chip (SoCs), or programmable logic devices (PLDs), such as field programmable gate arrays (FPGAs)). The disclosed embodiment can be used to generate test pattern targeting any type of fault, including for example stuck-at faults, transitions faults, path delay faults, bridging faults, and the like. Any of the methods or techniques described herein can be performed using software that comprises computer-executable instructions stored on one or more computer-readable media. Such software can comprise, for example, an electronic-design-automation (EDA) software tool, such as an automatic test pattern generation (ATPG) tool. Any such software can be executed on a single computer or on a networked computer system (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

One or more test patterns, test pattern values, or intermediate values that are produced by any of the disclosed methods, apparatus, and systems can also be stored on one or more computer-readable media and are considered to be within the scope of this disclosure. Computer-readable media storing such test patterns, test pattern values, or intermediate values may be accessed and used by a single computer, networked computer (such as those described above), or dedicated testing system (for example, a tester or automatic testing equipment (ATE)).

Any of the disclosed methods can be used in connection with the generation of test patterns in a computer simulation environment wherein test patterns are generated for representations of circuits, which are stored on one or more computer-readable media. For example, the disclosed methods are typically performed using circuit design information (for example, a netlist, HDL representation (such as a Verilog or VHDL file), RTL representation, GDSII representation, Oasis representation, and the like) that is loaded, received, or otherwise stored on computer-readable media associated with the computer system performing the methods. For presentation purposes, however, the present disclosure sometimes refers to the circuit and its circuit components by their physical counterpart (for example, scan cells, primary outputs, paths, circuit, and other such terms). It should be understood, however, that any such reference not only includes the physical components but also representations of such circuit components as are used in simulation, automatic test pattern generation, or other such EDA environments.

As used in this disclosure, the singular forms "a," "an," and "the" include the plural forms unless the context clearly dictates otherwise. Additionally, the term "includes" means "comprises."

Further, certain aspects of the disclosed technology involve storing or retrieving data from one or more lists. As used herein, the term "list" refers to a collection or arrangement of data that is usable by a computer. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database). Moreover, any of the lists discussed herein may be persistent (that is, the list may be stored in computer-readable media such that it is available beyond the execution of the application creating and using the list) or non-persistent (that is, the list may be only temporarily stored in computer-readable media such that it is cleared when the application creating and using the list is closed or when the list is no longer needed by the application).

As used in this disclosure the term "pseudo primary input (PPI)" refers to an output of a state element (such as a scan cell) in a logic circuit. The term "pseudo primary output (PPO)" refers to an input of a state element (such as a scan cell) in a logic circuit. The term "test pattern" refers to a set of specified values at the primary inputs and/or scan cells of a circuit. A test pattern is typically created to detect one or more defects in the circuit and is applied during manufacturing testing. The term "test cube" refers to a test pattern or portion of a test pattern having specified values at a subset of primary inputs and/or scan cells. The term "fill" refers to a process used to specify one or more unspecified values at primary inputs and/or scan cells in a test cube. The term "random fill" refers to a fill procedure wherein logic values are selected randomly (or pseudorandomly) to specify the unspecified values at primary inputs and/or scan cells in a test cube. The term "preferred value" refers to a preferred logic value for specifying one or more unspecified values at a primary input or a scan cell in a test cube that reduces power dissipation and/or supply currents. The term "preferred fill" refers to a fill procedure using one or more preferred values to specify the unspecified values (for example, all unspecified values) at primary inputs and scan cells in a test cube. The term "signal probability (SP)" refers to the probability of setting a logic value at a gate output (including a state element output, such as a scan cell output) in a logic circuit. The term "relaxed signal probability" refers to a signal probability calculated by ignoring the statistical correlation between gate inputs. The term "hold probability (HP)" refers to a probability of holding the same logic value at a gate output (including a state element output, such as a scan cell output) in a logic circuit for two or more consecutive clock cycles. The term "relaxed hold probability" refers to a hold probability calculated by ignoring the statistical correlation between gate inputs and assuming that there is no static hazard when holding the same logic value at a gate output. The term "weighted switching activity (WSA)" refers to a metric used to measure the power dissipation during test application (see, e.g., S. Gerstendorfer et al., "Minimized Power Consumption for Scan-Based BIST," IEEE International Test Conference, pp. 77-84 (1999)). For example, as used herein, the WSA of a gate in a circuit is the number of state changes at the gate multiplied by (1+number_of_gate_fanout) during capture cycles of a scan test. The WSA of the entire circuit during capture cycles of a scan test can be obtained by summing the WSAs of the gates in the circuit. The term "state element" refers to a sequential element (such as a flip-flop, latch, or other such memory element) and includes a scan cell.

FIG. 1 is a flow chart 100 of an exemplary low capture power test generation process according to the disclosed technology. In the exemplary embodiment, signal and hold probabilities are computed and used to help determine preferred values for circuit nodes (for example, for all circuit nodes). The preferred values can be determined statically and used to fill one or more unspecified values in a test cube (for example, all or a subset of unspecified values in a test cube) generated by a test generator. Moreover, in certain embodiments, the hold probabilities can be used to guide the test generation process in order to further reduce the switching activity created by the test cube.

At method act 110 of the illustrated embodiment, signal probabilities (for example, signal probabilities or relaxed signal probabilities) and hold probabilities (for example, hold probabilities or relaxed hold probabilities) are determined for gates in the circuit (for example, for every gate in the circuit). At method act 112, and as more fully explained below, preferred values for filling unspecified values at primary inputs and scan cells are determined (for example, based at least in part on the results from the hold probability computations). At method act 114, an initial target fault list is generated (for example, using well-known ATPG techniques). At method act 116, a test cube is generated for detecting one or more target faults in a fault list (for example, for a subset of the faults in the fault list). In some implementations, test cube generation is performed using an deterministic test generator. In particular implementations, and as more fully explained below, the justification process is guided by using one or more of the hold probabilities computed. At method act 118, the test cube is converted into a test pattern by filling unspecified values from the test cube with either preferred values (determined using the method act above, for example) or random values. When a subset of unspecified values are filled, a determination can be made as to which unspecified primary inputs and scan cells are desirably filled randomly in order to achieve a better tradeoff between capture power dissipation and test pattern count. At method act 120, fault simulation is performed to determine which faults of the fault list are detected by the pattern. The detected faults can then be removed from the fault list. At method act 122, a determination is made as to whether there are any remaining faults in the fault list to detect. If so, then the exemplary technique returns to method act 116, where a test cube is generated for a next subset of faults from the fault list; otherwise, the exemplary technique 100 terminates. In other embodiments of the disclosed technology, one or more of the above method acts are performed individually or in different combinations or subcombinations with one another.

The signal probabilities computed at method act 110 can be so-called "relaxed" signal probabilities. Relaxed signal probabilities can be calculated using standard signal probability calculation procedures (such as described, for example, in M. Abramovici, *Digital Systems Testing and Testable Design*, IEEE Press (1990)) and ignoring the statistical correlation between gate inputs. In one exemplary embodiment, the initial signal probabilities used in computing the signal probabilities of the state elements are set as follows. The signal probabilities for values 0 and 1 at the primary inputs are set to be SP(0)=SP(1)=0.5, which assumes a random starting value. In other embodiments, other starting values are used. The signal probabilities for values 0 and 1 at the PPIs of scan cells are set to be SP(0)=SP(1)=0.5 (or other desirable starting value). The signal probabilities for values 0 and 1 at the PPIs of non-scan cells are set according to the formula below, for example, where $L_v$ is equal to 1 if the non-scan cell can be initialized to value v by the scan loading operation; $d_v$ is the sequential depth to set the value v at the non-scan cell's output starting from unknown; and $\beta$ is an empirically weighted factor between 0 and 1:

$$SP(v) = 0.5 * \left((1-\beta)*L_v + \beta * \frac{1}{2^{d_v}}\right) v \in \{0, 1\} \quad (1)$$

The signal probabilities for values 0 and 1 at the outputs of ROMs and RAMs (or other memory elements) can also be set according to the same formula as above using the same or different value of $\beta$. In other embodiments of the disclosed technology, one or more of the above criteria are used individually or in different combinations or subcombination with one another.

Figure 2:
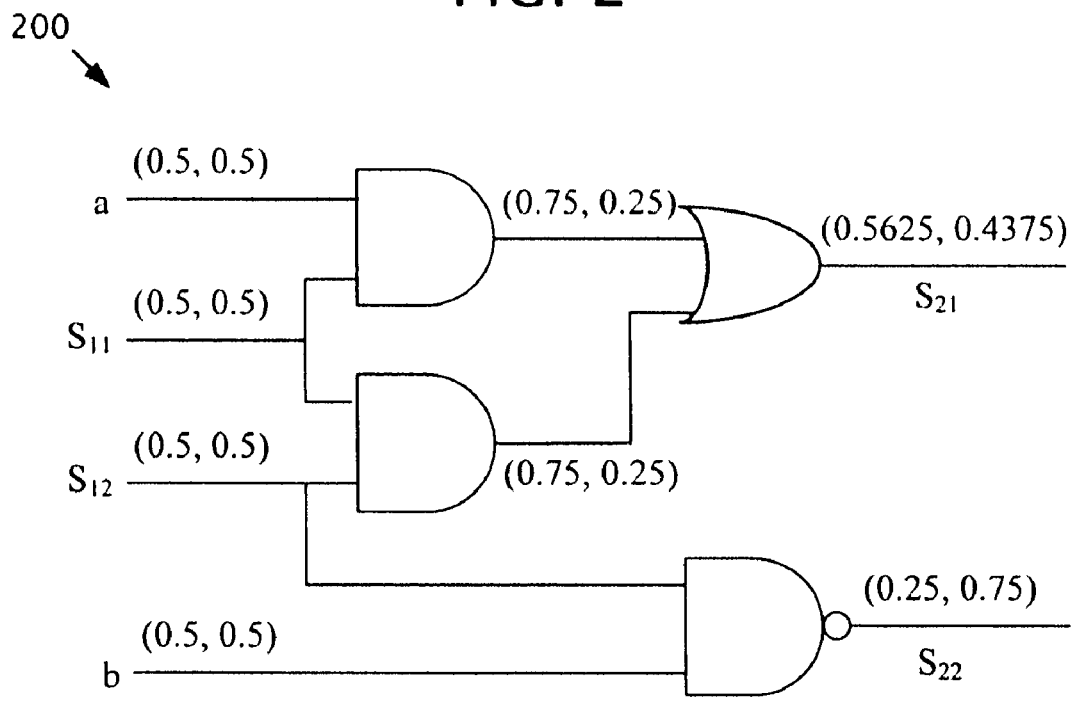
FIG. 2 is a schematic block diagram illustrating the computation of signal probabilities in a circuit portion.

FIG. 2 is a schematic block diagram illustrating how relaxed signal probability values can be calculated for gates in an exemplary circuit portion 200. In FIG. 2, a and b are primary inputs of the circuit portion 200. In FIG. 2, $\{s_{1i}, i=1$ to 2$\}$ represents the PPI of the ith scan cell, and $\{s_{2i}, i=1$ to 2$\}$ represents the PPO of the ith scan cell. In the figure, the first value and the second value in each parenthesis denote the signal 0 probability SP(0) and the signal 1 probability SP(1), respectively.

The signal probabilities can be determined by applying the logic function of the gate to the signal probabilities that are input into each respective gate using well-known static signal probability techniques. For example, in one embodiment, the signal 0 probability of an AND gate output c ($P_c(0)$) can be calculated from the signal 0 probabilities at the AND gate inputs a and b ($P_a(0)$, $P_b(0)$) as follows: $P_c(0)=P_a(0)+P_b(0)-(P_a(0)*P_b(0))$. The signal 1 probability of the AND gate can be computed as: $P_c(1)=P_a(1)*P_b(1)$. Similarly, the signal 0 probability of an OR gate can be calculated as: $P_c(0)=P_a(0)*P_b(0)$. And the signal 1 probability of an OR gate can be calculated as $P_c(1)=P_a(1)+P_b(1)-(P_a(1)*(P_b(1))$.

Figure 4:
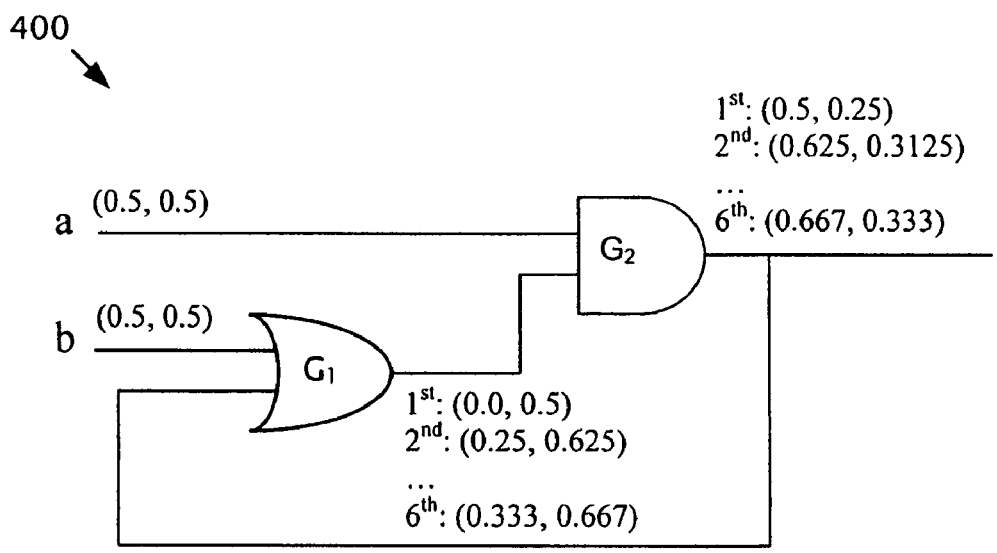
FIG. 4 is a schematic block diagram illustrating the computation of signal probabilities in combinational loops according to the exemplary method of FIG. 3.

Signal probabilities in combinational loops are also desirably considered. One exemplary procedure for calculating signal probabilities of gates in a combinational loop is method 300 shown in FIG. 3. At method act 310, "cuts" that break the combinational loops are identified. As used herein, a cut refers to a signal line that breaks the feedback connection among gates and, in one exemplary embodiment, both the signal probability 1 and the signal probability 0 at the cut are set to be 0 initially. At method act 312, the gates in the loop are assigned to a particular level (levelized). For instance, in one particular implementation, the cut points are initially assumed to be at a first level, and the next gate in the loop is assumed to be at a next level, and so on. With reference to FIG. 4, for example, gate $G_1$ is assigned to a lower level than gate $G_2$. At method act 314, the probabilities of the gates in the loop are evaluated according to their level order. In particular implementations, formula (1) from above or an equivalent relationship can be used to make this determination. At method act 316, the evaluation act (method act 314) is repeated until the number of iterations reaches a predefined limit (which can be predetermined or user-defined) and/or until there is no change of the probabilities at any gate in the loop (or until the change in probabilities is below some threshold, which can be predetermined or user selected).

FIG. 4 is a schematic block diagram illustrating an example of calculating relaxed signal probabilities of gates in a combinational loop 400 up to a sixth iteration. In the illustrated example, the cut point of the loop is at the connection from $G_2$ to $G_1$ (here, path 410).

Figure 5A:
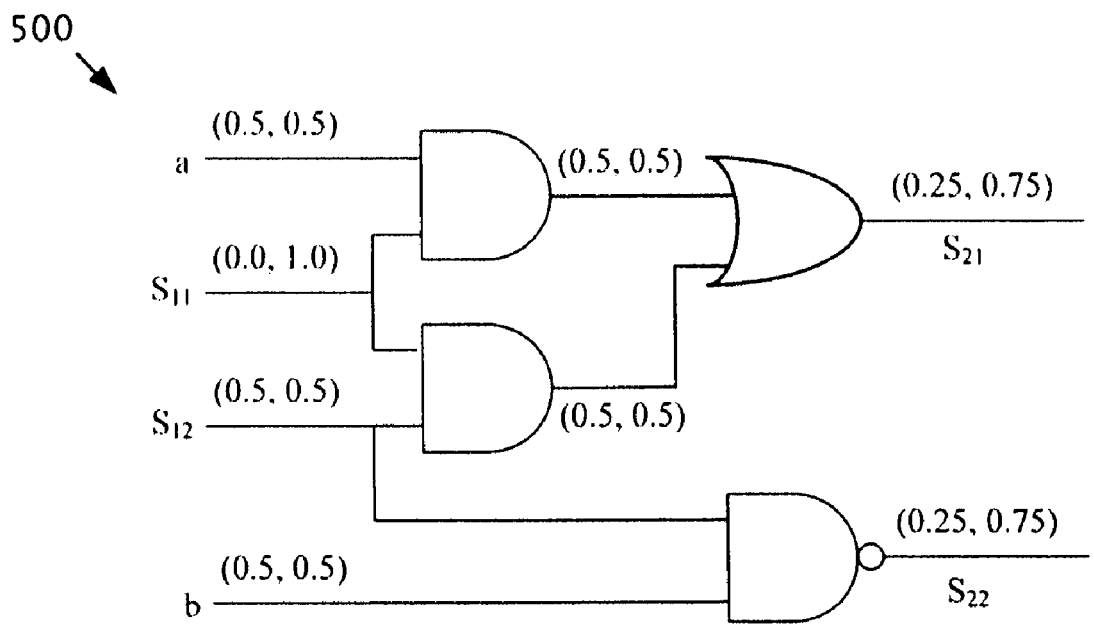
FIGS. 5(*a*) and 5(*b*) are schematic block diagrams illustrating the exemplary method of computing hold probabilities shown in FIG. 6.
Figure 5B:
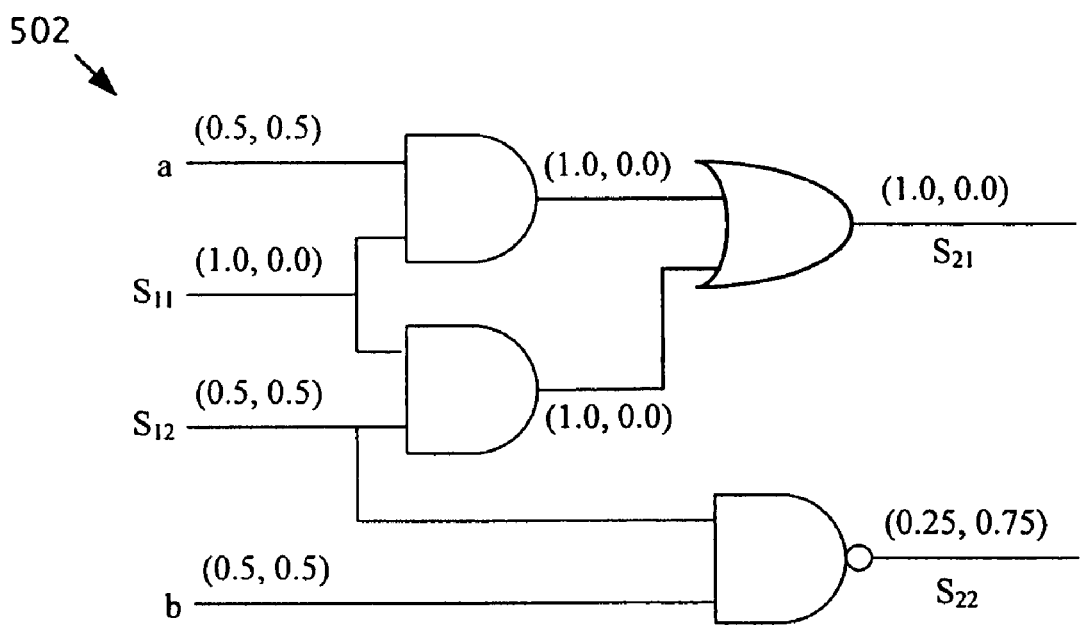

FIGS. 5(*a*) and 5(*b*) are schematic block diagrams 500, 502 showing examples of calculating hold probabilities (HPs) for the state element $s_{11}$ of the circuit portion 200 from FIG. 2 based on the relaxed signal probabilities. FIG. 6 is a flowchart showing one exemplary method 600 for calculating HPs of a state element (for example, for calculating hold probabilities at $s_{11}$ of FIG. 5). At method act 610, the signal 1 and signal 0 probabilities of the state element being analyzed are set to respective initial values. For example, in one particular implementation, the signal 1 probability is set to 1 and the signal 0 probability is set to 0. Thus, and as illustrated in FIG. 5(*a*), for $s_{11}$, the signal 1 probability of $s_{11}$ is set to 1.0 and the signal 0 probability of $s_{11}$ is set to 0.0. At method act 612, the signal probabilities (for example, the relaxed signal probabilities) of the downstream state elements are determined. Referring to FIG. 5(*a*), for example, the signal probabilities $SP_{s_{21}}^1(0)$, $SP_{s_{21}}^1(1)$ of $s_{21}$ are determined. At method act 614, the signal 1 and signal 0 probabilities of the state element are set to values opposite of (or otherwise different than) the initial values. For example, in one particular implementation, the signal 1 probability is set to 0.0 and the signal 0 probability is set to 1.0. For $s_{11}$, and as shown in FIG. 5(*b*), the signal 1 probability of $s_{11}$ is set to 0.0 and the signal 0 probability of $s_{11}$ is set to 1.0. At method act 616, the relaxed signal probabilities of the downstream state elements are determined using the updated values. For example, and referring to FIG. 5(*b*), the relaxed signal probabilities ($SP_{s_{21}}^0(0)$, $SP_{s_{21}}^0(1)$) of $s_{21}$ are calculated. At method act 618, the hold probabilities for the state element are computed (for example, using the relaxed signal probabilities computed at method acts 612 and 616). In one particular implementation, the hold probabilities are computed using the formula listed below, for instance, where $SP_{s_{11}}(0)$ and $SP_{s_{11}}(1)$ are the original signal probabilities at $s_{11}$:

$$HP_{s_{11}}(v) = SP_{s_{11}}(v) * SP_{s_{21}}{}^v(v), v \in \{0,1\} \quad (2)$$

In certain implementations, the method of calculating the hold probabilities at the state elements as described above is repeated for every state element in the circuit.

Another exemplary manner of calculating the hold probabilities at a state element (for example, such as the state element $s_{11}$ in the circuit shown in FIG. 2) comprises deriving the hold probabilities directly from the signal probabilities. This method is more approximate than using Equation (2), but can be computationally more efficient. In one particular implementation, the hold probabilities of a state element (here, $S_{11}$) are determined using the following formula:

$$HP_{s_{11}}(v) = SP_{s_{11}}(v) * SP_{s_{21}}(v), v \in \{0,1\} \quad (3)$$

This exemplary approach has linear computational complexity, and thus is scalable for any size for any size circuit.

To calculate the relaxed hold probabilities at gates other than primary inputs and state elements, a technique similar to that described above for relaxed signal probabilities can be used. In one preferred approach, the hold probabilities at primary inputs are initially set as $HP(0) = HP(1) = 0.25$ (or some other desired initial value).

The methods of calculating the signal probabilities and hold probabilities described above can also be used to consider the probabilities of signals U and Z, where U represents an unknown value and Z represents a high impedance state. Undriven pins and unmodeled core outputs can be treated as U. Their signal probabilities can be set as $SP(0) = SP(1) = SP(Z) = 0$ and $SP(U) = 1$, and their hold probabilities can be set as $HP(0) = HP(1) = HP(Z) = 0$ and $HP(U) = 1$. For the primary inputs, which can have a value of Z, the initial signal probabilities can be set, according to one exemplary embodiment, as $SP(0) = SP(1) = SP(Z) = \frac{1}{3}$ and $SP(U) = 0$, and the initial hold probabilities can be set, according to one exemplary embodiment, as $HP(0) = HP(1) = HP(Z) = \frac{1}{3}$ and $HP(U) = 0$. The signal and hold probabilities at other signal lines can be determined in a manner similar to the case when only Boolean gates and signal values 0 and 1 are needed.

In any of the embodiments described herein, either signal probabilities or relaxed signal probabilities can be used to aid low capture power ATPG. Similarly, either hold probabilities or relaxed hold probabilities can be used. In the following discussion and the claims, the terms are not distinguished, though it should be understood that either alternative or its equivalent could be used.

An exemplary method for determining the preferred value at a scan cell $s_i$ (as may be used at method act 112) for example, comprises the following: setting the preferred value at $s_i$ to be 0 if $HP_{s_i}(0) > HP_{s_i}(1)$ and $$\frac{|HP_{s_i}(0) - HP_{s_i}(1)|}{MAX(HP_{s_i}(0), HP_{s_i}(1))} > \varepsilon;$$

setting the preferred value at $s_i$ to be 1 if $HP_{s_i}(1) > HP_{s_i}(0)$ and $$\frac{|HP_{s_i}(1) - HP_{s_i}(0)|}{MAX(HP_{s_i}(0), HP_{s_i}(1))} > \varepsilon;$$

and setting the preferred value at $s_i$ to be a random value if $$\frac{|HP_{s_i}(0) - HP_{s_i}(1)|}{MAX(HP_{s_i}(0), HP_{s_i}(1))} \leq \varepsilon,$$

where $\varepsilon$ denotes an empirically determined non-negative number. Signal probabilities can also be used at the PPOs of the scan cells to replace the hold probabilities shown above when determining the preferred values. When taking the shift power reduction into account, the preferred value at $s_i$ in the exemplary method listed above is not set randomly if $$\frac{|HP_{s_i}(0) - HP_{s_i}(1)|}{MAX(HP_{s_i}(0), HP_{s_i}(1))} \leq \varepsilon.$$

Instead, in one particular embodiment, a constant logic value v is used as the preferred value at $s_i$, where v is chosen as logic value 0 if the total number of scan cells satisfying $HP_{s_i}(0) > HP_{s_i}(1)$ and $$\frac{|HP_{s_i}(0) - HP_{s_i}(1)|}{MAX(HP_{s_i}(0), HP_{s_i}(1))} > \varepsilon$$

not less than the total number of scan cells satisfying $HP_{s_i}(1) > HP_{s_i}(0)$ and $$\frac{|HP_{s_i}(1) - HP_{s_i}(0)|}{MAX(HP_{s_i}(0), HP_{s_i}(1))} > \varepsilon.$$

Otherwise, v is chosen as logic value 1.

An exemplary procedure for determining the preferred value at a primary input $pi_i$ comprises the following: calculating hold probability improvements (HPI) for values 0 and 1; setting the preferred value at $pi_i$ to be 0 if $HPI_{pi_i}(0) > HPI_{pi_i}(1)$ and $$\frac{|HPI_{pi_i}(0) - HPI_{pi_i}(1)|}{MAX(HPI_{pi_i}(0), HPI_{pi_i}(1))} > \delta;$$

setting the preferred value at $pi_i$ to be 1 if $HPI_{pi_i}(1) > HPI_{pi_i}(0)$ and $$\frac{|HPI_{pi_i}(1) - HPI_{pi_i}(0)|}{MAX(HPI_{pi_i}(0), HPI_{pi_i}(1))} > \delta;$$

and setting the preferred value at $pi_i$ to be a random value if $$\frac{|HPI_{pi_i}(1) - HPI_{pi_i}(0)|}{MAX(HPI_{pi_i}(0), HPI_{pi_i}(1))} \leq \delta,$$

where δ denotes an empirically determined non-negative number. The preferred value selected at $pi_i$ can also correspond to the value Z in the manner similar to the values 0 and 1 if $pi_i$ can take value Z.

An exemplary procedure for calculating HPI(v) at a primary input $pi_i$, comprises changing the hold probabilities at $pi_i$ to be 1.0 for the value v and to 0.0 for other values, and summing the hold probability differences at internal gates (for example, every internal gate) due to the value changes at $pi_i$.

In one exemplary embodiment of the disclosed technology, the act of filling unspecified values in a test cube with preferred values is performed simultaneously or substantially simultaneously. Thus, the act of filling can be scalable to circuits having any size. The exemplary procedure for filling unspecified values in a test cube with preferred values is sometimes referred to herein as "preferred fill." It should be noted that using different values to fill the unspecified values at primary inputs and scan cells typically has no impact on fault coverage.

Figure 7:
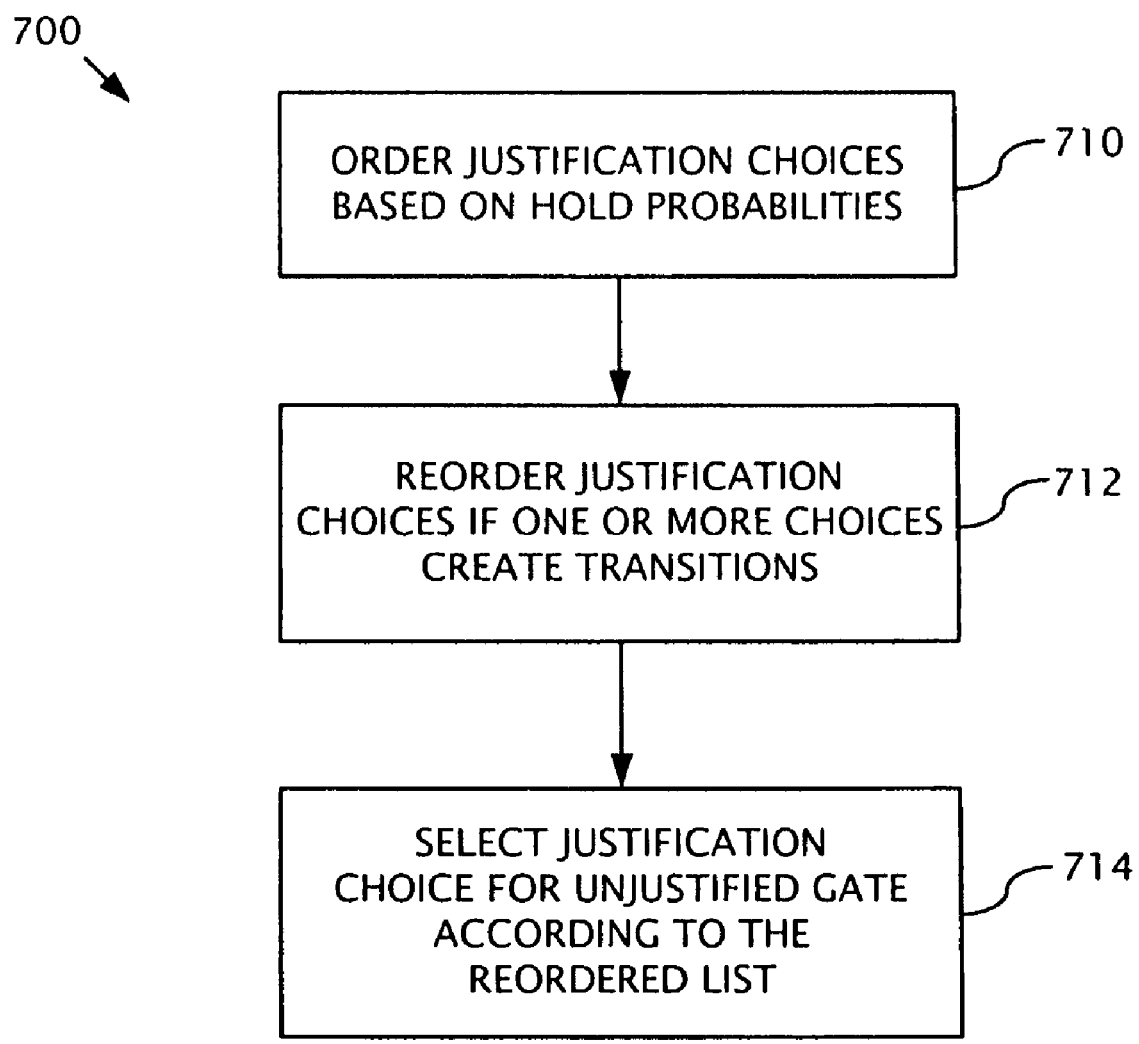
FIG. 7 is a flowchart illustrating an exemplary method of using hold probabilities (for example, as computed by the exemplary method of FIG. 5) to guide the justification process performed during test pattern generation.

In certain embodiments of the disclosed technology, capture power consumption can also be reduced by accounting for power concerns during the justification process in test cube generation. For example, FIG. 7 shows an exemplary method 700 for reducing power during the justification process. At method act 710, justification choices for an unjustified gate are ordered. For instance, the justification choices can be ordered based at least in part on the probabilities of each choice. In certain exemplary embodiments, the hold probabilities are desirably used as metrics to guide test cube generation. In particular embodiments, for one or more choices on the ordered list at method act 712 (for example, for each choice on the list), the choice can be moved toward the end of the list (for example, to the end of the ordered list) if the selected choice creates a transition after checking the values of the choice at a previous time frame and/or a next time frame. At method act 714, the unjustified gate is justified according to the ordered list.

Figure 8A:
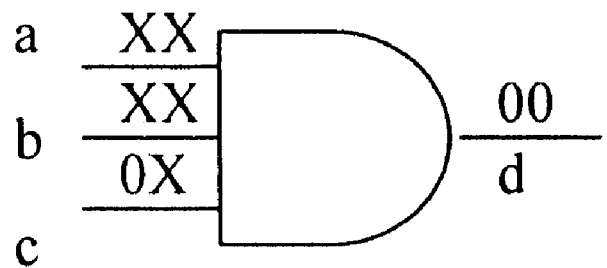
FIGS. 8(*a*) and (*b*) are schematic block diagrams illustrating application of the exemplary method shown in FIG. 7 to an AND gate having three inputs.
Figure 8B:
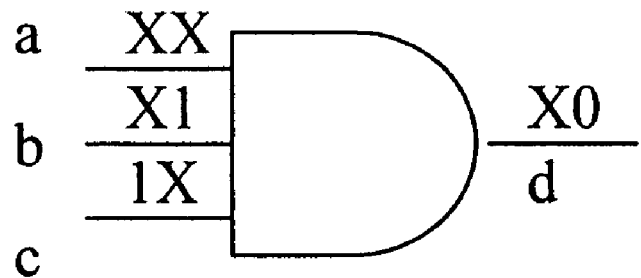

FIGS. 8(a) and 8(b) are block diagrams 800, 802 that illustrate method 700 in the context of justifying d=0 in the second time frame of illustrated AND gate 810. Two values are shown for each of the inputs and the output. The first value is representative of the value in a first time frame, and the second value is representative of the value in a second time frame. In this example, it is desired to justify a value of 0 at the output d in the second time frame.

The values at the AND gate 810 inputs in FIG. 8 correspond to the values before justification. As shown in FIG. 8(a), the input c=0 in the first time frame has the highest hold probability and will initially be selected first. The input b=0 is chosen next, and the input a=0 last. Although the input c has a logic value 0 in the first time frame, it will not create a transition at c when c=0 is selected to justify d in the second time frame.

In FIG. 8(b), however, picking c=0 in the second time frame as the justification choice creates a transition at c since c=1 in the previous frame. Hence (in FIG. 8(b) and according to the method 700), a=0 is picked as the first choice even though it has a lower hold probability than the choice c=0. Changing the choice order for justifying a gate ordinarily has no impact on the completeness of the search space for creating a test cube. Thus, the choice order typically has no impact on fault coverage.

FIG. 9 is another exemplary method 900 for reducing capture power dissipation during test pattern generation. In particular, method 900 is a method for filling unspecified values in a generated test cube (for example, in a test cube having one or more specified values targeting faults from the fault list). At method act 910, the test cube to be filled is simulated. For example, a simulation of the test cube being applied to the integrated circuit is performed. At method act 912, gates, state elements, or both gates and state elements with values X0, X1, 0X and 1X in adjacent time frames are identified from the simulation results. At method act 914, the test cube is expanded by justifying all or a subset of the gates and state elements identified such that they respectively have a common value in adjacent time frames. For example, the justification can proceed in the manner described above with respect to method 700. An exemplary method to order the gates and state elements with values X0, X1, 0X and 1X in adjacent time frames for justification at the method act 914 is according to the increasing order of their combinational depth from the primary inputs and the pseudo primary inputs. At method act 916, the unspecified values in the expanded test cube are filled with preferred and/or random values to complete a test pattern.

Figure 10:
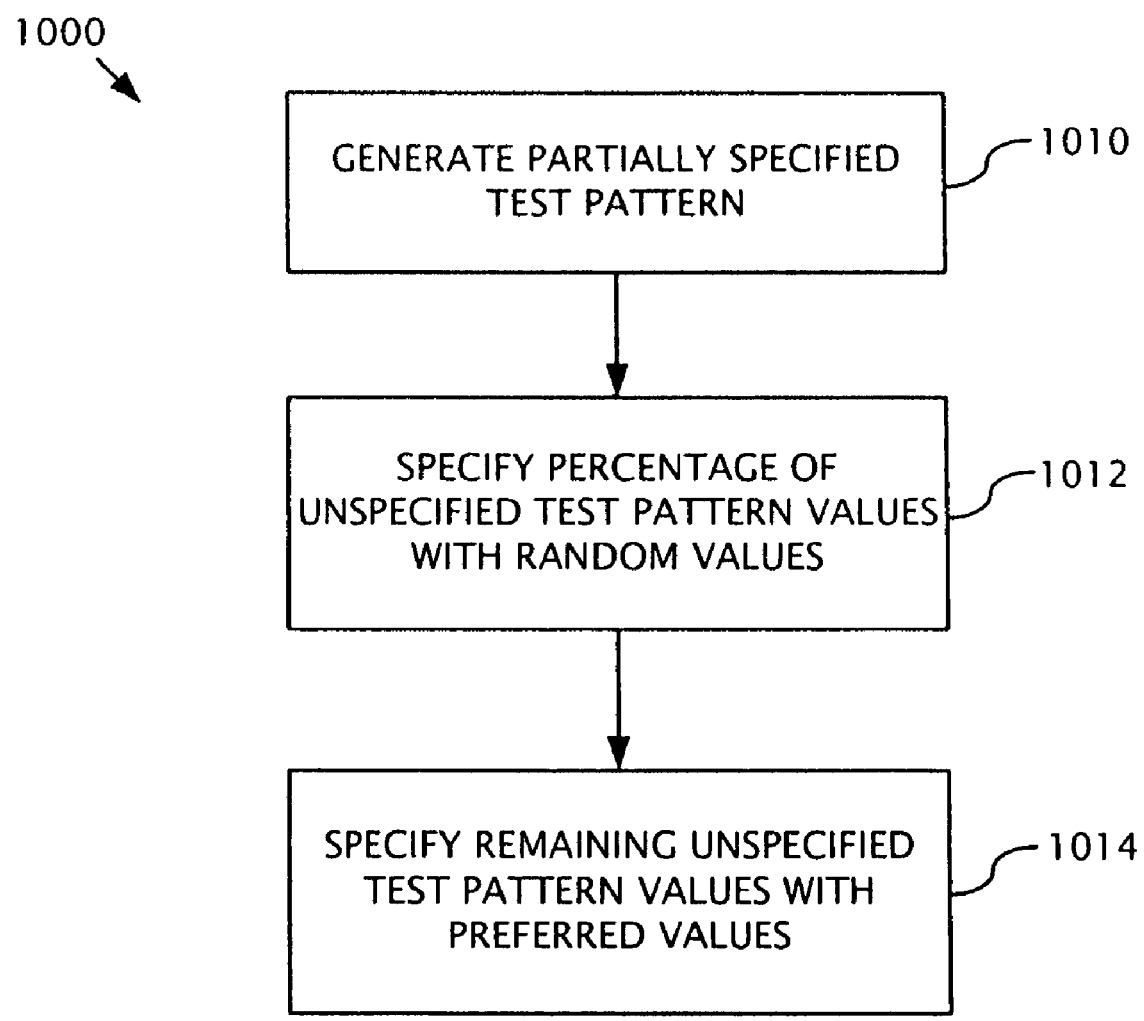
FIG. 10 is a flowchart illustrating an exemplary test pattern generation methodology that uses both preferred values and random values to specify unspecified values.

In comparison to randomly filling unspecified values, the various procedures for reducing capture power dissipation described herein typically increase the test pattern count. To help reduce the increase in test pattern count when filling with one or more preferred values, a procedure referred to herein as "limited preferred fill" can be performed. An exemplary embodiment of a limited preferred fill method 1000 is shown in FIG. 10. At method act 1010, a test cube to be filled is generated. At method act 1012, some percentage of unspecified values is filled using random fill. At method act 1014, the remaining unspecified values are filled using preferred values.

In some embodiments, the test pattern count can be reduced by selecting the unspecified values to be filled randomly according to one or more criteria. For example, in one exemplary embodiment, the clock sequence in the test cube to be filled is analyzed; undetected faults in the fault list that can be tested by a similar clock sequence are identified; and the primary inputs and the scan cells that may be used to detect one or more of the undetected faults found are identified and selected as candidates to be filled randomly. Further, in some embodiments, the values at each primary input and each scan cell that have a better chance to detect additional faults are also determined.

Exemplary embodiments of the method described above were implemented and verified using seven different chip designs. In particular, the exemplary method shown in FIG. 1 was implemented using the preferred fill procedure explained above. The results are displayed in Table 1 and Table 2. In both tables, the capture power is estimated by using the weighted switching activity (WSA) metric (see, e.g., S. Gerstendorder et al., "Minimized Power Consumption for Scan-Based BIST," 1999 *IEEE International Test Conference*, pp. 77-84).

TABLE 1

WSA reductions with preferred fill and ATPG embodiments

| | Preferred Fill | | | | | Preferred Fill + ATPG | | | | |
|---|---|---|---|---|---|---|---|---|---|---|
| | | 1st Capture | | 2nd Capture | | | 1st Capture | | 2nd Capture | |
| Circuit | Pat. Inc. % | Ave. Red. % | Peak Red. % | Ave. Red. % | Peak Red. % | Pat. Inc. % | Ave. Red. % | Peak Red. % | Ave. Red. % | Peak Red. % |
| ckt1 | 66.61% | 45.77% | 36.74% | 25.81% | 32.42% | 80.07% | 47.87% | 33.51% | 27.80% | 24.99% |
| ckt2 | 133.13% | 60.04% | 62.47% | 33.80% | 46.16% | 29.20% | 58.31% | 66.65% | 38.20% | 44.07% |
| ckt3 | 158.07% | 70.16% | 56.51% | 69.10% | 61.82% | 81.99% | 74.00% | 44.29% | 69.72% | 55.47% |
| ckt4 | 170.83% | 79.35% | 66.95% | 43.32% | 51.95% | 182.20% | 80.61% | 66.41% | 44.60% | 55.13% |
| ckt5 | 219.12% | 67.21% | 66.38% | 50.69% | 66.88% | 303.39% | 63.32% | 66.65% | 44.26% | 68.67% |
| ckt6 | 95.57% | 59.94% | 51.63% | 47.56% | 44.69% | 181.33% | 71.62% | 63.20% | 52.76% | 46.88% |
| ckt7 | 170.51% | 67.56% | 68.32% | 58.04% | 70.94% | 25.88% | 69.54% | 71.96% | 58.62% | 72.95% |
| Average | 144.83% | 64.29% | 58.43% | 46.90% | 53.55% | 126.29% | 66.47% | 58.95% | 47.99% | 52.59% |

Table 1 shows transition fault test generation results from using exemplary embodiments of the preferred fill procedure with two sets of data. The first set of data, given under the Preferred Fill columns, corresponds to a case when the exemplary preferred fill procedure was used alone without modifying the test generation procedure. The second set of data, given under the Preferred Fill+ATPG columns, corresponds to a case when the test generation procedure was modified by employing hold probabilities to guide the justification procedure during the test generation process (using the exemplary procedure outlined above and illustrated in FIG. 7). The pattern counts and WSAs given in Table 1 show a percentage increase or decrease relative to their respective values when random fill is used. The percentage increase in pattern count is given under column Pat. Inc. %. The percentage decreases in average WSA and peak WSA for each capture cycle are given under the columns Average Red. % and Peak Red. %, respectively.

It can be seen that, on average, when just the preferred fill procedure is used, the average WSA and the peak WSA are reduced by 64.29% and 58.43% in the first capture cycle and by 46.90% and 53.55% in the second capture cycle. The data in Table 1 for the case when hold probabilities in test generation are used together with the exemplary preferred fill procedure (shown in the Preferred Fill+ATPG columns) indicates that both peak and average WSA can be further reduced if hold probabilities are used to guide ATPG. Additionally, it can be observed that pattern counts do not increase as much as when only the preferred fill procedure is used.

Table 2 shows the results for when up to 10% of the unspecified values are filled using random fill and the remaining unspecified values are filled using the exemplary preferred fill procedure. The data in Table 2 is arranged in a manner identical to that in Table 1. The data listed in Table 2 shows that when using the limited preferred fill procedure, the test pattern counts increase, on average, by only 37.53% instead of 144.83% when preferred fill is used without any random fill. The average percentage reduction in average WSA for the first capture cycle, however, is reduced to 47.78% from 64.29%. Similar reductions in the percentage reductions of peak as well as the percentage reductions of WSA during second capture cycle can also be observed. The second set of data in Table 2 shows that the percentage increase in pattern counts is moderated when the exemplary limited preferred fill is used with a modified ATPG procedure. These results show that a desirable tradeoff between power dissipation and test pattern count can be achieved when using the exemplary limited preferred fill procedure.

Figure 11:
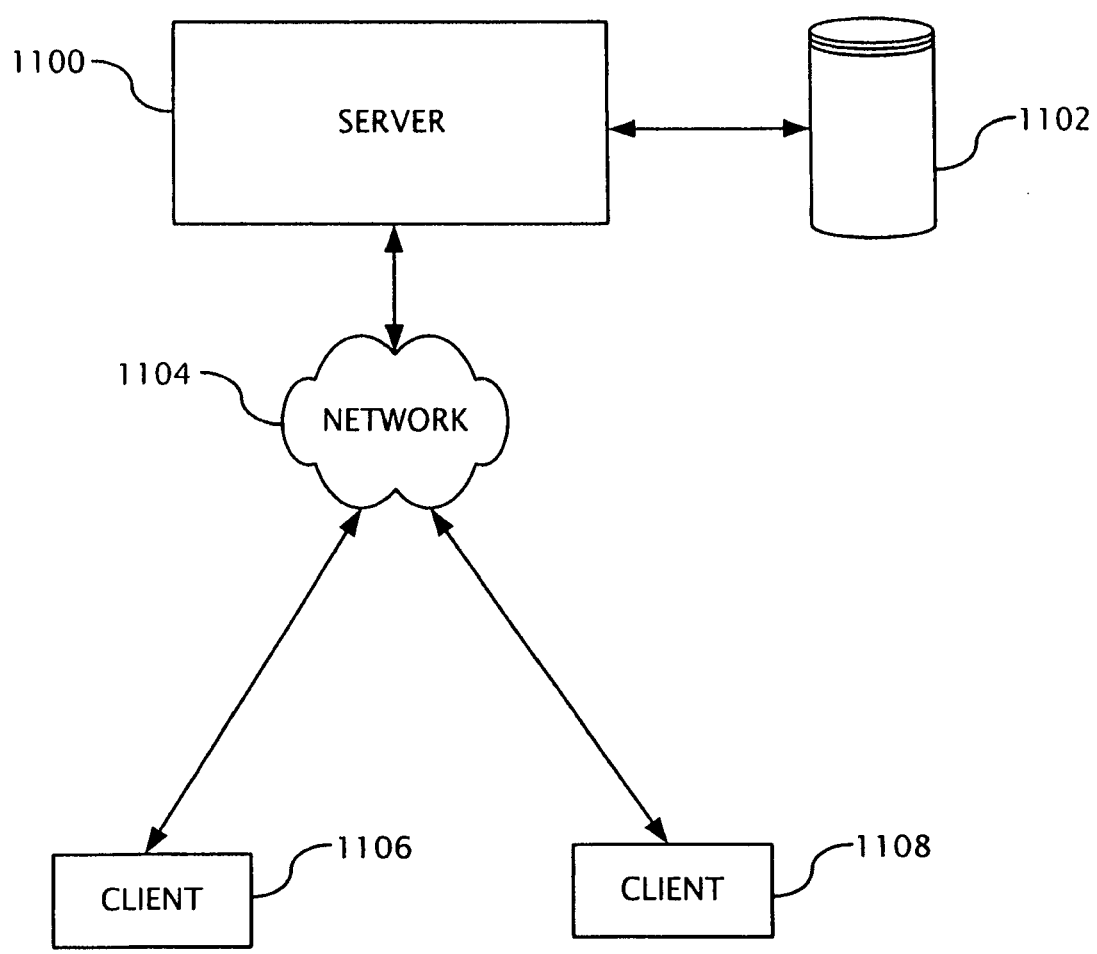
FIG. 11 is a schematic block diagram of a network as may be used to generate test patterns according to any of the disclosed embodiments.

Any of the aspects of the technology described above may be performed using a distributed computer network. FIG. 11 shows one suitable exemplary network. A server computer 1100 can have an associated storage device 1102 (internal or external to the server computer). For example, the server computer 1100 can be configured to generate test patterns or test pattern values using any of the disclosed methods (for example, as part of an EDA software tool, such as a test pattern generation tool). The server computer 1100 can be coupled to a network, shown generally at 1104, which can

TABLE 2

WSA reductions with limited preferred fill

| | Preferred Fill + 10% Random Fill | | | | | Preferred Fill + ATPG + 10% Random Fill | | | | |
|---|---|---|---|---|---|---|---|---|---|---|
| | | 1st Capture | | 2nd Capture | | | 1st Capture | | 2nd Capture | |
| Circuit | Pat. Inc. % | Ave. Red. % | Peak Red. % | Ave. Red. % | Peak Red. % | Pat. Inc. % | Ave. Red. % | Peak Red. % | Ave. Red. % | Peak Red. % |
| ckt1 | 23.99% | 36.87% | 26.49% | 21.61% | 25.28% | 34.18% | 41.78% | 26.46% | 25.86% | 24.14% |
| ckt2 | 28.10% | 38.40% | 40.10% | 4.31% | 22.11% | 10.11% | 36.46% | 43.96% | 17.36% | 20.21% |
| ckt3 | 25.63% | 58.50% | 41.42% | 54.20% | 48.31% | 27.15% | 62.43% | 38.30% | 60.36% | 49.47% |
| ckt4 | 36.23% | 59.05% | 52.27% | 27.79% | 43.69% | 90.80% | 73.28% | 52.06% | 39.37% | 52.95% |
| ckt5 | 59.76% | 40.72% | 51.90% | 38.52% | 54.44% | 105.85% | 48.45% | 54.45% | 39.32% | 58.86% |
| ckt6 | 51.03% | 51.75% | 44.63% | 42.55% | 35.78% | 111.25% | 66.56% | 61.57% | 50.39% | 43.58% |
| ckt7 | 38.00% | 49.19% | 52.63% | 47.85% | 65.85% | −14.53% | 57.41% | 60.88% | 51.42% | 67.66% |
| Average | 37.53% | 47.78% | 44.21% | 33.83% | 42.21% | 52.12% | 55.20% | 48.24% | 40.58% | 45.27% | comprise, for example, a wide-area network, a local-area network, a client-server network, the Internet, or other suitable network. One or more client computers, such as those shown at 1106, 1108, may be coupled to the network 1104 using a network protocol. The work may also be performed on a single, dedicated workstation, which has its own memory and one or more CPUs.

Figure 12:
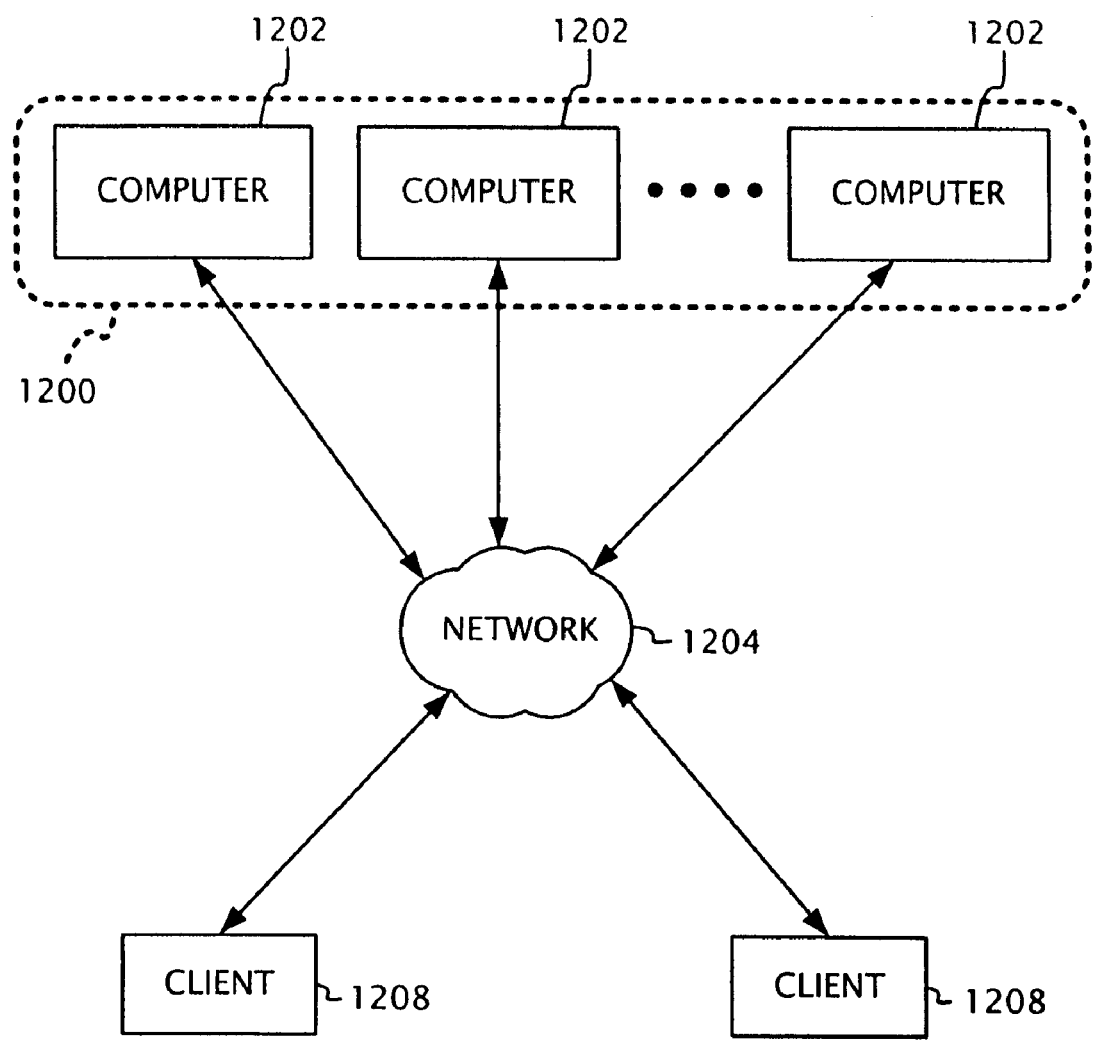
FIG. 12 is a schematic block diagram of a distributed computing network as may be used to generate test patterns according to any of the disclosed embodiments.

FIG. 12 shows another exemplary network. One or more computers 1202 communicate via a network 1204 and form a computing environment 1200 (for example, a distributed computing environment). Each of the computers 1202 in the computing environment 1200 can be used to perform at least a portion of the test pattern generation process. The network 1204 in the illustrated embodiment is also coupled to one or more client computers 1208.

FIG. 13 shows that design information for a circuit-under-test (for example, an HDL file, netlist, GDSII file, Oasis file, or other suitable design file representing the circuit-under-test together with its scan chains) can be analyzed using a remote server computer (such as the server computer 1100 shown in FIG. 11) or a remote computing environment (such as the computing environment 1200 shown in FIG. 12) in order to generate test patterns or test pattern values according to any embodiment of the disclosed technology. At process block 1302, for example, the client computer sends the integrated circuit design information to the remote server or computing environment. In process block 1304, the integrated circuit design information is received and loaded by the remote server or by respective components of the remote computing environment. In process block 1306, test pattern generation is performed to produce test patterns according to any of the disclosed embodiments. At process block 1308, the remote server or computing environment sends the resulting test patterns to the client computer, which receives the data at process block 1310.

It should be apparent to those skilled in the art that the example shown in FIG. 13 is not the only way to generate test patterns using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the test pattern generation procedure.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims. We therefore claim as our invention all that comes within the scope and spirit of these claims.

The invention claimed is:

1. A method of generating test patterns for testing an integrated circuit, comprising:
    determining hold probabilities for state elements of a circuit design, the hold probability for a respective state element indicating the probability that the respective state element will output the same logic value during two or more consecutive clock cycles;
    generating a test cube targeting one or more faults in the circuit design, the test cube initially comprising specified values that target the one or more faults and further comprising unspecified values;
    modifying the test cube by specifying at least a portion of the unspecified values with values determined at least in part from the hold probabilities; and
    storing the modified test cube.

2. The method of claim 1, wherein the state elements comprise scan cells of the circuit design.

3. The method of claim 1, wherein the act of determining the hold probabilities comprises determining signal probabilities for logic gates of the circuit design, and wherein the hold probabilities are based at least in part on the signal probabilities.

4. The method of claim 1, wherein the circuit design comprises one or more combinational loops, and wherein the act of determining the hold probabilities further comprises determining signal probabilities for logic gates in one or more of the combinational loops.

5. The method of claim 4, wherein the act of determining signal probabilities for the logic gates in the one or more of the combinational loops comprises iteratively computing the signal probabilities of the logic gates in the combinational loops.

6. The method of claim 1, wherein the method further comprises determining preferred values for inputting into primary inputs, scan cells, or both primary inputs and scan cells of the circuit design, the preferred values being determined at least in part from the hold probabilities.

7. The method of claim 6, wherein the act of modifying the test cube comprises assigning one or more of the preferred values to corresponding ones of the primary inputs or scan cells.

8. The method of claim 1, wherein the act of modifying the test cube comprises simultaneously specifying the at least a portion of the unspecified values with values determined at least in part from the hold probabilities.

9. The method of claim 1, wherein the act of modifying the test cube comprises specifying a first portion of the unspecified values, the method further comprising specifying a second portion of the unspecified values of the test cube with randomly selected values.

10. The method of claim 9, wherein the first portion of the unspecified values or the second portion of the unspecified values comprises a predetermined percentage of the unspecified values.

11. The method of claim 9, wherein the specification of the first portion of the unspecified values and the second portion of the unspecified values results in all of the unspecified values of the test cube being specified.

12. A method of generating test patterns for testing an integrated circuit design, comprising:
    selecting one or more faults to target from a fault list;
    generating a first set of test pattern values that target the one or more selected faults;
    generating a second set of test pattern values that reduces power consumption in the integrated circuit design during testing, the second set of test pattern values being determined at least in part from probability values indicating whether one or more state elements in the integrated circuit design will output constant logic values over two or more consecutive clock cycles; and
    storing a test pattern comprising at least the first set of test pattern values and the second set of test pattern values.

13. The method of claim 12, wherein the state elements comprise scan cells.

14. The method of claim 12, wherein the second set of test pattern values causes no transitions to occur at one or more of the state elements of the integrated circuit design during a capture cycle of testing.

15. The method of claim 12, wherein the method further comprises generating a third set of test pattern values comprising randomly selected values, and wherein the third set of test pattern values is also part of the stored test pattern.

16. The method of claim 15, wherein the third set of test pattern values is generated before the second set of test pattern values but after the first set of test pattern values.

17. The method of claim 15, wherein the third set of test pattern values is generated for a predetermined percentage of the remaining test pattern values to be specified after the first set of test pattern values is generated.

18. The method of claim 12 further comprising:
   determining signal probabilities for the one or more logic gates, a respective one of the signal probabilities indicating the probability that a respective logic gate will have either a logic 0 or a logic 1 value; and
   determining the probability values indicating whether one or more state elements in the integrated circuit design will output constant logic values over two or more consecutive clock cycles using the signal probabilities.

19. The method of claim 12, further comprising:
   simulating the test pattern to determine which faults of the fault list are detected by the test pattern;
   updating the fault list to remove the faults that are detected by the test pattern; and
   repeating the acts of selecting, generating the first portion, generating the second portion, and storing the test pattern using the updated fault list.

20. A method of generating test patterns for testing an integrated circuit, comprising:
   determining hold probabilities for state elements and internal gates of a circuit design, the hold probability indicating the probability that a respective state element or internal gate will output a constant logic value during two or more consecutive clock cycles;
   generating a test cube targeting one or more faults in the circuit design, the test cube initially comprising specified values that target the one or more faults and unspecified values, wherein the act of generating the test cube comprises selecting specified values that justify a desired test value to a logic gate output, the selection being based at least in part on the hold probabilities; and
   storing the specified values of the test cube.

21. The method of claim 20, wherein the act of selecting the specified values that justify the desired test value to the logic gate output comprises ordering justification choices for the logic gate output based on the hold probabilities.

22. The method of claim 20, wherein the act of selecting the specified values that justify the desired test value to the logic gate output further comprises:
   evaluating one or more of the justification choices to determine whether selection of the one or more of the justification choices would cause a transition to occur at one or more of the state elements in the circuit design; and
   reordering the justification choices so that the evaluated justification choices that would cause the transition to occur are not selected.

23. The method of claim 20, further comprising modifying the test cube by specifying at least a portion of the unspecified values with values determined at least in part from the hold probabilities.

24. A method of generating test patterns for testing an integrated circuit, comprising:
   generating a test cube targeting one or more faults in a circuit design, the test cube initially comprising specified values that target the one or more faults and unspecified values;
   simulating application of the test cube to the circuit design;
   identifying one or more logic gate outputs or state elements that have a respective known value in a first time frame and an unknown value in a second time frame, the first time frame and the second time frame being consecutive time frames;
   expanding the test cube by specifying one or more of the unspecified values in the test cube with values that cause one or more of the identified logic gate outputs or state elements to have the respective known value during both the first time frame and the second time frame; and
   storing the expanded test cube.

25. The method of claim 24, wherein the first time frame is before the second time frame.

26. The method of claim 24, wherein the second time frame is before the first time frame.

27. The method of claim 24, wherein the act of generating the test cube comprises:
   selecting specified values that justify a desired test value to a logic gate output, the selection being based at least in part on the hold probabilities; and
   storing the specified values of the test cube.

* * * * *